United States Patent
Hwang et al.

(10) Patent No.: US 11,142,462 B2
(45) Date of Patent: Oct. 12, 2021

(54) TRICHLORODISILANE

(71) Applicant: Jiangsu Nata Opto-Electronic Materials Co. Ltd., Jiangsu (CN)

(72) Inventors: Byung K Hwang, Midland, MI (US); Travis Sunderland, Midland, MI (US); Xiaobing Zhou, Midland, MI (US)

(73) Assignee: JIANGSU NATA OPTO-ELECTRONIC MATERIALS CO. LTD., Jiangsu Province (CN)

( * ) Notice: Subject to any disclaimer, the term of this patent is extended or adjusted under 35 U.S.C. 154(b) by 122 days.

(21) Appl. No.: 16/327,872

(22) PCT Filed: Sep. 21, 2017

(86) PCT No.: PCT/US2017/052609
§ 371 (c)(1),
(2) Date: Feb. 25, 2019

(87) PCT Pub. No.: WO2018/057677
PCT Pub. Date: Mar. 29, 2018

(65) Prior Publication Data
US 2019/0218103 A1    Jul. 18, 2019

Related U.S. Application Data

(60) Provisional application No. 62/399,709, filed on Sep. 26, 2016.

(51) Int. Cl.
| | | |
|---|---|---|
| C23C 16/34 | (2006.01) | |
| C01B 33/107 | (2006.01) | |
| C23C 16/455 | (2006.01) | |

(52) U.S. Cl.
CPC .......... *C01B 33/107* (2013.01); *C23C 16/345* (2013.01); *C23C 16/45542* (2013.01); *C23C 16/45553* (2013.01); *C01B 33/1071* (2013.01)

(58) Field of Classification Search
None
See application file for complete search history.

(56) References Cited

U.S. PATENT DOCUMENTS

| | | |
|---|---|---|
| 5,210,255 A | 5/1993 | Kalchauer et al. |
| 7,540,920 B2 | 6/2009 | Singh et al. |
| 9,926,203 B2 | 3/2018 | Zhou |
| 2004/0224089 A1 | 11/2004 | Singh et al. |
| 2005/0145177 A1* | 7/2005 | McSwiney ............ C23C 16/345 118/723 MA |
| 2008/0026149 A1 | 1/2008 | Tomasini et al. |
| 2008/0224089 A1 | 9/2008 | Pei |
| 2011/0129618 A1 | 6/2011 | Matsunaga et al. |
| 2012/0161281 A1* | 6/2012 | Hasunuma ............ H01L 28/92 257/532 |
| 2015/0099374 A1 | 4/2015 | Kakimoto et al. |
| 2016/0358767 A1 | 12/2016 | Nitta et al. |

OTHER PUBLICATIONS

Search report for corresponding International Application No. PCT/US2017/052609 dated Nov. 20, 2017.
Chinese search report for corresponding Application No. 201780057569.3 dated Jul. 26, 2020.
Search report for corresponding Taiwan Application No. 106133001 dated Nov. 18, 2020.

* cited by examiner

*Primary Examiner* — Shamim Ahmed
*Assistant Examiner* — Bradford M Gates
(74) *Attorney, Agent, or Firm* — Morgan, Lewis & Bockius LLP

(57) ABSTRACT

Disclosed is a Silicon Precursor Compound for deposition, the Silicon Precursor Compound comprising trichlorodisilane; a composition for film forming, the composition comprising the Silicon Precursor Compound and at least one of an inert gas, molecular hydrogen, a carbon precursor, nitrogen precursor, and oxygen precursor; a method of forming a silicon-containing film on a substrate using the Silicon Precursor Compound, and the silicon-containing film formed thereby.

5 Claims, No Drawings

TRICHLORODISILANE

The present invention generally relates to a precursor compound and composition for film forming, to a method for forming a film with the precursor compound or composition via a deposition apparatus, and to the film formed by the method.

Elemental silicon, and other silicon materials such as silicon oxide, silicon carbide, silicon nitride, silicon carbonitride, and silicon oxycarbonitride, have a variety of known uses. For example, silicon film may be used as a semiconductor, an insulating layer or a sacrificial layer in the manufacture of electronic circuitry for electronic or photovoltaic devices.

Known methods of preparing the silicon material may use one or more silicon precursors. Use of these silicon precursors is not limited to making silicon for electronic or photovoltaic semiconductor applications. For example, silicon precursors may be used to prepare silicon-based lubricants, elastomers, and resins.

We see a long-felt need in the electronics and photovoltaic industries for improved silicon precursors. We think improved precursors would enable lowering of deposition temperatures and/or making finer semiconductor features for better performing electronic and photovoltaic devices.

SUMMARY OF THE INVENTION

We have discovered an improved silicon precursor. The present invention provides each of the following embodiments:

A precursor compound for deposition, the precursor compound comprising trichlorodisilane (hereinafter, "Silicon Precursor Compound").

A composition for film forming, the composition comprising the Silicon Precursor Compound and at least one of an inert gas, molecular hydrogen, a carbon precursor, nitrogen precursor, and oxygen precursor.

A method of forming a silicon-containing film on a substrate, the method comprising subjecting a vapor of a silicon precursor consisting of trichlorodisilane to deposition conditions in the presence of the substrate so as to form a silicon-containing film on the substrate, wherein the silicon-containing film is a silicon nitrogen film or a silicon oxygen film and the method uses atomic layer deposition.

A film formed in accordance with the method.

DETAILED DESCRIPTION OF THE INVENTION

The Brief Summary and Abstract are incorporated here by reference. The invention embodiments, uses and advantages summarized above are further described below.

Aspects of the invention are described herein using various common conventions. For example, all states of matter are determined at 25° C. and 101.3 kPa unless indicated otherwise. All % are by weight unless otherwise noted or indicated. All % values are, unless otherwise noted, based on total amount of all ingredients used to synthesize or make the composition, which adds up to 100%. Any Markush group comprising a genus and subgenus therein includes the subgenus in the genus, e.g., in "R is hydrocarbyl or alkenyl," R may be alkenyl, alternatively R may be hydrocarbyl, which includes, among other subgenuses, alkenyl. For U.S. practice, all U.S. patent application publications and patents referenced herein, or a portion thereof if only the portion is referenced, are hereby incorporated herein by reference to the extent that incorporated subject matter does not conflict with the present description, which would control in any such conflict.

Aspects of the invention are described herein using various patent terms. For example, "alternatively" indicates a different and distinct embodiment. "Comparative example" means a non-invention experiment. "Comprises" and its variants (comprising, comprised of) are open ended. "Consists of" and its variants (consisting of) is closed ended. "Contacting" means bringing into physical contact. "May" confers a choice, not an imperative. "Optionally" means is absent, alternatively is present.

Aspects of the invention are described herein using various chemical terms. The meanings of said terms correspond to their definitions promulgated by IUPAC unless otherwise defined herein. For convenience, certain chemical terms are defined.

The term "deposition" is a process of generating, on a specific place, condensed matter. The condensed matter may or may not be restricted in dimension. Examples of deposition are film-forming, rod-forming, and particle-forming depositions.

The term "film" means a material that is restricted in one dimension. The restricted dimension may be characterized as "thickness" and as the dimension that, all other things being equal, increases with increasing length of time of a process of depositing said material to form the film.

The term "halogen" means fluorine, chlorine, bromine or iodine, unless otherwise defined.

The term "IUPAC" refers to the International Union of Pure and Applied Chemistry.

The term "lack" means free of or a complete absence of.

"Periodic Table of the Elements" means the version published 2011 by IUPAC.

The term "precursor" means a substance or molecule containing atoms of the indicated element and being useful as a source of that element in a film formed by a deposition method.

The term "separate" means to cause to physically move apart, and thus as a result is no longer in direct touching.

The term "substrate" means a physical support having at least one surface upon which another material may be hosted.

This invention provides the Silicon Precursor Compound and the composition for film forming. The Silicon Precursor Compound is particularly suitable for deposition process for forming silicon-containing films, although the Silicon Precursor Compound is not limited to such applications. For example, the Silicon Precursor Compound may be utilized in other applications, e.g. as a reactant for preparing siloxane or silazane materials. This invention further provides the method of forming a film and the film formed in accordance with the method.

The Silicon Precursor Compound has the chemical name, trichlorodisilane, which is of the general formula $R_3SiSiR_3$, where each R is independently H or Cl, provided that three of the R groups are Cl (i.e., is according to the chemical formula $H_3Si_2Cl_3$). When the Silicon Precursor Compound is used in the present composition and method, the Silicon Precursor Compound may have a purity of from 99 area % (GC) to 99.9999999 area % (GC).

The Silicon Precursor Compound may be provided in any manner. For example, the Silicon Precursor Compound may by synthesized or otherwise obtained for use in the method. In an embodiment the Silicon Precursor Compound is synthesized by thermal coupling (heating at 450° C.) of silane ($SiH_4$) and silicon tetrachloride ($SiCl_4$). Additional embodiments for synthesizing the Silicon Precursor Compound include reductive coupling of silicon tetrachloride with hydrogen in the presence or absence of silicon, dehydrochlorinative coupling between silicon tetrachloride and silane, hydrochlorination of silicon or metal silicides such as magnesium silicide and copper silicide, partial reduction of hexachlorodisilane with metal hydrides such as LiH, $LiAlH_4$, NaH, $NaAlH_4$, $LiAl(OBu-t)_3H$, $LiAl(Bu-i)_2(OBu-t)H$, diisobutylaluminum hydride, Vitride $NaBH_4$, $Mg(BH_4)_2$, $(CH_3)_4N(BH_4)$, $KB(C_2H_5)_3H$, N-Selectride, L-Selectride, K-Selectride and KS-Selectride, and chlorination of disilane. The Silicon Precursor Compound may be separated via evaporation or stripping.

As mentioned above, the composition for film forming comprises the Silicon Precursor Compound and at least one of an inert gas, molecular hydrogen, a carbon precursor, a nitrogen precursor, and an oxygen precursor, alternatively an inert gas, a nitrogen precursor, and an oxygen precursor. The molecular hydrogen may be used with the Silicon Precursor Compound in the composition for forming an elemental silicon film including amorphous, polycrystalline silicon and monocrystalline films. A vaporous or gaseous state of the molecular hydrogen, carbon precursor, nitrogen precursor or oxygen precursor may be generally referred to herein as an additional reactant gas.

The carbon precursor may be used with the Silicon Precursor Compound in the composition for forming a silicon carbon film according to an embodiment of the method. The silicon carbon film contains Si and C atoms and may comprise silicon carbide. The carbon precursor may comprise, alternatively consist essentially of, alternatively consist of C, H, and optionally Si atoms. The carbon precursor that comprises C, H, and optionally Si atoms may further comprise N or O atoms when the carbon precursor is used in the method for forming a silicon carbonitride film or silicon oxycarbide film, respectively, or may further comprise N and O atoms when the carbon precursor is used in the method for forming a silicon oxycarbonitride film. The carbon precursor that consists essentially of C, H, and optionally Si atoms lacks N and O atoms, but may optionally have one or more halogen atoms (e.g., Cl). Examples of the carbon precursor consisting of C and H atoms are hydrocarbons such as alkanes. Examples of the carbon precursor consisting of C, H and Si atoms are hydrocarbylsilanes such as butyldisilane or tetramethylsilane.

The nitrogen precursor may be used with the Silicon Precursor Compound in the composition for forming a silicon nitrogen film according to an embodiment of the method. The silicon nitrogen film contains Si and N atoms and optionally C and/or O atoms and may comprise silicon nitride, silicon oxynitride, or silicon oxycarbonitride. The silicon nitride may be $Si_xN_y$ wherein subscript x is 1, 2 or 3 and subscript y is an integer from 1 to 5. The nitrogen precursor may comprise N atoms and optionally H atoms, alternatively the nitrogen precursor may consist essentially of N atoms and optionally H atoms, alternatively the nitrogen precursor may consist of N and optionally H atoms. The nitrogen precursor that comprises N and optionally H atoms may further comprise C or O atoms when the nitrogen precursor is used in the method for forming a silicon carbonitride film or silicon oxynitride film, respectively, or may further comprise C and O atoms when the nitrogen precursor is used in the method for forming a silicon oxycarbonitride film. The nitrogen precursor that consists essentially of N atoms and optionally H atoms lacks C and O atoms, but optionally may have one or more halogen atoms (e.g., Cl). An example of the nitrogen precursor consisting of N atoms is molecular nitrogen. Examples of the nitrogen precursor consisting of N and H atoms are ammonia and hydrazine. An example of the nitrogen precursor consisting of O and N atoms is nitric oxide ($N_2O$) and nitrogen dioxide ($NO_2$).

The oxygen precursor may be used with the Silicon Precursor Compound in the composition for forming a silicon oxygen film according to an embodiment of the method. The silicon oxygen film contains Si and O atoms and optionally C and/or N atoms and may comprise silicon oxide, silicon oxycarbide, silicon oxynitride, or silicon oxycarbonitride. The silicon oxide may be SiO or $SiO_2$. The oxygen precursor may comprise O atoms and optionally H atoms, alternatively may consist essentially of O atoms and optionally H atoms, alternatively may consist of O atoms and optionally H atoms. The oxygen precursor that comprises O atoms and optionally H atoms may further comprise C or N atoms when the oxygen precursor is used in the method for forming a silicon oxycarbide or silicon oxynitride film, respectively, or may further comprise C and N atoms when the oxygen precursor is used in the method for forming a silicon oxycarbonitride film. Examples of the oxygen precursor consisting of O atoms are molecular oxygen and ozone. Ozone can be delivered at up to 5% v/v in air or up to 14% v/v in molecular oxygen. Examples of the oxygen precursor consisting of O and H atoms are water and hydrogen peroxide. An example of the oxygen precursor consisting of O and N atoms is nitric oxide and nitrogen dioxide.

The inert gas may be used in combination with any one of the foregoing precursors and any embodiment of the composition or method. Examples of the inert gas are helium, argon, and a mixture thereof. For example, helium may be used in combination with the Silicon Precursor Compound and molecular hydrogen in an embodiment of the method wherein the silicon containing film that is formed is an elemental silicon film. Alternatively, helium may be used with the Silicon Precursor Compound and any one of the carbon precursor, nitrogen precursor and oxygen precursor in an embodiment of the method wherein the silicon containing film that is formed is a silicon carbon film, silicon nitrogen film, or silicon oxygen film respectively.

The film formed by the method is a material containing Si and is restricted in one dimension, which may be referred to as thickness of the material. The silicon containing film may be an elemental silicon film, a silicon carbon film, a silicon nitrogen film, or a silicon oxygen film. (e.g., silicon nitride, silicon carbonitride, silicon oxynitride, or silicon oxycarbonitride film, alternatively a silicon nitrogen film or a silicon oxygen film (e.g., silicon nitride, silicon oxide). The elemental silicon film formed by the method lacks C, N and O atoms and may be an amorphous or crystalline Si material. The silicon carbon film formed by the method contains Si and C atoms and optionally N and/or O atoms. The silicon nitrogen film formed by the method contains Si and N atoms and optionally C and/or O atoms. The silicon oxygen film formed by the method contains Si and O atoms and optionally C and/or N atoms.

The film may be useful in electronics and photovoltaic applications. E.g., the silicon nitride film may be formed as an insulator layer, passivation layer, or a dielectric layer between polysilicon layers in capacitors.

A method of forming a silicon-containing film on a substrate, the method comprising subjecting a vapor of a silicon precursor comprising trichlorodisilane to deposition conditions in the presence of the substrate so as to form a silicon-containing film on the substrate The method of forming a film uses an atomic layer deposition apparatus. The deposition apparatus utilized in the method is generally selected based upon the desired method of forming the film and may be any deposition apparatus known by those of skill in the art.

In certain embodiments, the deposition apparatus comprises a physical vapor deposition apparatus. In these embodiments, the deposition apparatus is typically selected from a sputtering apparatus and a direct current (DC) magnetron sputtering apparatus. The optimum operating parameters of each of these physical deposition vapor apparatuses are based upon the Silicon Precursor Compound utilized in the method and the desired application in which the film formed via the deposition apparatus is utilized. In certain embodiments, the deposition apparatus comprises a sputtering apparatus. The sputtering apparatus may be, for example, an ion-beam sputtering apparatus, a reactive sputtering apparatus, or an ion-assisted sputtering apparatus.

Preferably, however, the deposition apparatus comprises an atomic layer deposition apparatus. In embodiments using the atomic layer deposition apparatus, the method of forming the film may be referred to as an atomic layer deposition method and includes plasma enhanced atomic layer deposition (PEALD), spatial atomic layer deposition (SALD) and thermal atomic layer deposition (TALD). Atomic layer deposition methods are generally well known in the art.

In embodiments of the method using the chemical vapor deposition apparatus, the chemical vapor deposition apparatus may be selected from, for example, a flowable chemical vapor apparatus, a thermal chemical vapor deposition apparatus, a plasma enhanced chemical vapor deposition apparatus, a photochemical vapor deposition apparatus, an electron cyclotron resonance apparatus, an inductively coupled plasma apparatus, a magnetically confined plasma apparatus, a low pressure chemical vapor deposition apparatus and a jet vapor deposition apparatus. The optimum operating parameters of each of these chemical deposition vapor apparatuses are based upon the Silicon Precursor Compound utilized in the method and the desired application in which film formed via the deposition apparatus is utilized. In certain embodiments, the deposition apparatus comprises a plasma enhanced chemical vapor deposition apparatus. In other embodiments, the deposition apparatus comprises a low pressure chemical vapor deposition apparatus.

In chemical vapor deposition, gases for forming the film are typically mixed and reacted in a deposition chamber. The reaction forms the proper film elements or molecules in a vapor state. The elements or molecules then deposit on a substrate (or wafer) and build up to form the film. Chemical vapor deposition generally requires the addition of energy to the system, such as heating of the deposition chamber and substrate.

Reaction of gaseous species is generally well known in the art and any conventional chemical vapor deposition (CVD) technique can be carried out via the present method. For example, methods such as simple thermal vapor deposition, plasma enhanced chemical vapor deposition (PECVD), electron cyclotron resonance (ECRCVD), atmospheric pressure chemical vapor deposition (APCVD), low pressure chemical vapor deposition (LPCVD), ultrahigh vacuum chemical vapor deposition (UHVCVD), aerosol-assisted chemical vapor deposition (AACVD), direct liquid injection chemical vapor deposition (DLICVD), microwave plasma-assisted chemical vapor deposition (MPCVD), remote plasma-enhanced chemical vapor deposition (RPECVD), atomic layer chemical vapor deposition (ALCVD), hot wire chemical vapor deposition (HWCVD), hybrid physical-chemical vapor deposition (HPCVD), rapid thermal chemical vapor deposition (RTCVD), and vapor-phase epitaxy chemical vapor deposition (VPECVD), photo-assisted chemical vapor disposition (PACVD), flame assisted chemical vapor deposition (FACVD), or any similar technique may be used.

When plasma enhanced atomic layer deposition methods are employed, the plasma comprises forming gas plasma, nitrogen plasma or ammonia plasma in either nitrogen or argon gas as a carrier or oxygen plasma. Forming gas comprises nitrogen and hydrogen. One skilled in the art would understand the composition of forming gas.

Chemical vapor deposition may be utilized to form films having a wide variety of thicknesses contingent on a desired end use of the film. For instance, the film may have a thickness of a few nanometers or a thickness of a few microns, or a greater or lesser thickness (or a thickness falling between these values). These films may optionally be covered by coatings, such as $SiO_2$ coatings, $SiO_2$/modifying ceramic oxide layers, silicon-containing coatings, silicon carbon-containing coatings, silicon carbide-containing coatings, silicon nitrogen-containing coatings, silicon nitride-containing coatings, silicon nitrogen carbon-containing coatings, silicon oxygen nitrogen containing coatings, and/or diamond like carbon coatings. Such coatings and their methods of deposition are generally known in the art.

The substrate utilized in the method is not limited. In certain embodiments, the substrate is limited only by the need for thermal and chemical stability at the temperature and in the environment of the deposition chamber. Thus, the substrate can be, for example, glass, metal, plastic, ceramic, semiconductor including silicon (e.g. monocrystalline silicon, polycrystalline silicon, amorphous silicon, etc).

Embodiments of the present method may include a reactive environment comprising nitrous oxide ($N_2O$). Such reactive environments are generally known in the art. In these embodiments, the method generally involves decomposing the Silicon Precursor Compound in the presence of nitrous oxide. An example of such a method is described in U.S. Pat. No. 5,310,583. Utilizing nitrous oxide may modify the composition of the resulting film formed in the chemical vapor deposition method.

The chemical vapor deposition apparatus and, thus, the chemical vapor deposition method utilized is generally selected by balancing a number of factors, including, but not limited to, the Silicon Precursor Compound, desired purity of the film, geometric configuration of the substrate, and economic considerations.

The main operating variables manipulated in chemical vapor deposition and atomic layer deposition include, but are not limited to, reactor temperature, substrate temperature, pressure, a concentration in the gas phase of the Silicon Precursor Compound, any additional reactant gas concentration (e.g., concentration of gas of any carbon precursor, nitrogen precursor, and/or oxygen precursor), and total gas flow and substrate. Chemical vapor deposition and atomic layer deposition is generated from chemical reactions which include, but are limited to, pyrolysis, oxidation, reduction, hydrolysis, and combinations thereof. Selecting the optimal temperature for chemical vapor deposition and atomic layer deposition requires an understanding of both the kinetics and thermodynamics of the Silicon Precursor Compound and the chosen chemical reaction.

Conventional chemical vapor deposition and atomic layer deposition methods generally require significantly high reactor temperatures, such as greater than 600° C., e.g. 600° to 1000° C. However, it is believed that the Silicon Precursor Compound may be utilized in chemical vapor deposition and atomic layer deposition at much lower reactor temperatures. For example, the method may be carried out at a reactor temperature of from 100° to 1000°, alternatively from 200° to 800°, alternatively from 200° to 600°, alternatively from 200° to 500°, alternatively from 200° to 400° C., alternatively from 100° to 300° C. The reactor temperature at which the method is carried out may be isothermal or dynamic.

Chemical vapor deposition and atomic layer deposition processes are conducted at a pressure from approximately 0.01 torr to 100 torr, alternatively from 0.01 to 10 torr, alternatively from 0.1 to 10 torr, alternatively from 1 to 10 torr.

Chemical vapor deposition and atomic layer deposition processes generally involve generating a precursor, transporting the precursor into a reaction chamber, and either absorption of precursors onto a heated substrate or chemical reaction of the precursor and subsequent absorption onto the substrate. The following sets forth a cursory survey of chemical vapor deposition and atomic layer deposition methods to illustrate some of the vast options available. These methods can be adapted for atomic layer deposition by one skilled in the art.

In Chemical vapor deposition and atomic layer deposition processes, the film produced has a thickness from 0.01 nm to 1 µm alternatively from 0.1 to 100 nm, alternatively from 1 to 100 nm, alternatively from 10 to 100 nm.

Chemical vapor deposition and atomic layer deposition processes involve a substrate. The substrate can be, for example, glass, metal, plastic, ceramic, semiconductor including silicon (e.g. monocrystalline silicon, polycrystalline silicon, amorphous silicon, etc). The substrate can have a flat or a patterned surface. A patterned surface has features with an aspect ratio ranging from 1 to 500, alternatively from 1 to 50, alternatively from 10 to 50. The CVD or ALD films can be conformal on both the flat or patterned substrate surface.

In thermal CVD, the film is deposited by passing a stream of a vaporized form of the Silicon Precursor Compound over a heated substrate. When the vaporized form of the Silicon Precursor Compound contacts the heated substrate, the Silicon Precursor Compound generally reacts and/or decomposes to form the film.

In PECVD, a vaporized form of the Silicon Precursor Compound is reacted by passing it through a plasma field to form a reactive species. The reactive species is then focused and deposited on the substrate the form the film. Generally, an advantage of PECVD over thermal CVD is that lower substrate temperature can be used. The plasmas utilized in PECVD comprise energy derived from a variety of sources such as electric discharges, electromagnetic fields in the radio-frequency or microwave range, lasers or particle beams. Generally, PECVD utilizes radio frequency (10 kilohertz (kHz)-102 megahertz (MHz)) or microwave energy (0.1-10 gigahertz (GHz)) at moderate power densities (0.1-5 watts per square centimeter ($W/cm^2$)), although any of these variables may be modified. The specific frequency, power, and pressure, however, are generally tailored to the deposition apparatus.

In AACVD, the Silicon Precursor Compound is dissolved in a chemical medium to form a mixture. The mixture comprising the Silicon Precursor Compound and the chemical medium is packaged in a traditional aerosol. The aerosol atomizes and introduces the Silicon Precursor Compound into a heated chamber where the Silicon Precursor Compound undergoes decomposition and/or chemical reaction. One advantage of AACVD is the ability to form the film without necessitating a vacuum.

In plasma enhanced atomic layer deposition (PEALD), the vapor of the Silicon Precursor Compound is flowed into a PEALD reactor for a certain length of time. The ALD reactor is then purged with an inert gas to remove any residual vapor of the Silicon Precursor Compound. Next, a reactant gas plasma is flowed over the substrate surface for a certain length of time. The ALD reactor is then purged with an inert gas to remove any residual reactant gas plasma. The foregoing sequence of steps (Silicon Precursor, purging, reactant gas plasma, purging) is then repeated until a conformal silicon-containing film with a desired thickness is formed on the substrates.

In thermal atomic layer deposition (ALD), the vapor of the Silicon Precursor Compound is flowed into a thermal ALD reactor for a certain length of time. The ALD reactor is then purged with an inert gas to remove any residual vapor of the Silicon Precursor Compound. Next, a reactant gas is flowed over the substrate surface for a certain length of time. The ALD reactor is then purged with an inert gas to remove any residual reactant gas. The foregoing sequence of steps (Silicon Precursor, purging, reactant gas, purging) is then repeated until a conformal silicon-containing film with a desired thickness is formed on the substrates.

The chosen deposition process and operating parameters will have impact on the structure and properties of the film. Generally, it is possible to control the orientation of film structure, the manner in which the film coalesces, the uniformity of the film, and crystalline/non-crystalline structure of the film.

It is to be noted that environments which facilitate the desired deposition can also be used in the deposition chamber. For instance, reactive environments such as air, oxygen, oxygen plasma, ammonia, amines, hydrazine, etc. or inert environments may all be used herein.

Additionally, the present invention provides a film formed in accordance with the method. The composition and structure of the film is a function of not only the deposition apparatus and its parameters, but also the Silicon Precursor Compound utilized and the presence or absence of any reactive environment during the method. The Silicon Precursor Compound may be utilized in combination with any other known precursor compounds or may be utilized in the method free from any other precursor compounds.

Because the Silicon Precursor Compound lacks at least one Si—N bond and Si—C bond and Si—O bond, the Silicon Precursor Compound may be utilized to form elemental silicon film.

Alternatively, the Silicon Precursor Compound may be utilized with other silicon-based precursor compounds traditionally utilized to form silicon films comprising crystalline silicon or silicon nitride. In such embodiments, the films may be, for example, crystalline or epitaxial. Contingent on the presence of reactive environments during the method, the film may further comprise oxygen and/or carbon in addition to silicon and nitrogen.

Etch resistance is an important characteristics of dense and defect-free silicon-containing films. Etch resistance can be measured with a dry etch method or a wet etch method known in the art. A low etch rate, e.g., a low wet etch rate (WER), is an indicator for a dense and defect-free, and therefore, a high quality films. There always is a need for etch resistant silicon-containing films with low dry or wet etch rate.

In one embodiment, the silicon-containing film deposited at 500° C. has a WER of less than 3.6, alternatively less than 2.0, alternatively less than 1.2 nanometers/minute at using a 500:1 HF:water solution.

Purity of the Silicon Precursor Compound may be determined by $^{29}$Si-NMR, reverse phase liquid chromatography or, more likely, by gas chromatography (GC) as described later. For example, the purity determined by GC may be from 60 area % to ≤100 area % (GC), alternatively from 70 area % to ≤100 area % (GC), alternatively from 80 area % to ≤100 area % (GC), alternatively from 90 area % to ≤100 area % (GC), alternatively from 93 area % to ≤100 area % (GC), alternatively from 95 area % to ≤100 area % (GC), alternatively from 97 area % to ≤100 area % (GC), alternatively from 99.0 area % to ≤100 area % (GC). Each ≤100 area % (GC) independently may be as defined previously.

EXAMPLES

The invention is further illustrated by, and an invention embodiment may include any combinations of features and limitations of, the non-limiting examples thereof that follow. Ambient temperature is about 23° C. and all percents are weight percent unless indicated otherwise. The following table includes abbreviations used in the examples.

TABLE 1 abbreviations used in the Examples.

| Abbreviation | |
|---|---|
| sccm | Standard cubic centimeters per minute |
| ° C. | Degrees Celsius |
| WER | Wet etch rate |
| GPC | Growth per cycle measured in angstroms (Å) |
| RI | Refractive Index |
| nm | Nanometers |
| RF | Plasma power in Watts |
| SiN | Silicon nitride |
| HF | Hydrogen Fluoride |
| min | Minute |
| FG | Forming gas (10% $H_2$ and balance $N_2$) |
| Å | Angstroms |

Thin Film Characterization Method: The thickness of thin film and refractive index (at 632.8 nm) of silicon nitride were measured using spectroscopic ellipsometry (M-2000DI, J.A. Woollam). Ellipsometry data were collected from 375 nm to 1690 nm and analyzed using either Cauchy or Tauc-Lorentz oscillator model with a software provided by J.A. Woollam.

Wet Etch Rate (WER): Wet etch rate tests of the thin films grown by PEALD process were performed using 500:1 HF:water solution at room temperature. The wet etch rate was calculated from the thickness difference before and after etching for a specified amount of time.

Gas Chromatography Thermal Conductivity Detector (GC-TCD) conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas is helium gas used at a flow rate of 105 mL per minute. GC instrument is an Agilent model 7890A gas chromatograph. Inlet temperature is 200° C. GC experiment temperature profile consist of soaking (holding) at 50° C. for 2 minutes, ramping temperature up at a rate of 15° C./minute to 250° C., and then soaking (holding) at 250° C. for 10 minutes.

GC-MS instrument and conditions: Sample is analyzed by electron impact ionization and chemical ionization gas chromatography-mass spectrometry (EI GC-MS and CI GC-MS). Agilent 6890 GC conditions include a DB-1 column with 30 meters (m)×0.25 millimeter (mm)×0.50 micrometer (μm) film configuration. An oven program of soaking at 50° C. for 2 minutes, ramping at 15° C./minute to 250° C., and soaking at 250° C. for 10 minutes. Helium carrier gas flowing at constant flow of at 1 mL/minute and a 50:1 split injection. Agilent 5973 MSD conditions include a MS scan range from 15 to 800 Daltons, an EI ionization and CI ionization using a custom CI gas mix of 5% $NH_3$ and 95% $CH_4$.

$^{29}$Si-NMR instrument and solvent: a Varian 400 MHz Mercury spectrometer is used. $C_6D_6$ is used as the solvent.

$^1$H-NMR instrument and solvent: a Varian 400 MHz Mercury spectrometer is used. $C_6D_6$ is used as the solvent.

Example 1 (prophetic): synthesis of trichlorodisilane: heat silane and silicon tetrachloride at a temperature of 450° C. to yield trichlorodisilane according to known methods from the literature, and distill the trichlorodisilane from the resulting reaction mixture to give a purified trichlorodisilane.

Example 2 (prophetic): forming an elemental silicon film using the Silicon Precursor Compound with LPCVD: using a LPCVD reactor and a bubbler containing the Silicon Precursor Compound and in fluid communication with the LPCVD reactor. Then flow hydrogen carrier gas through the bubbler to carry vapor of the Silicon Precursor Compound into the LPCVD reactor, wherein the LPCVD reactor contains a plurality of vertically oriented and spaced apart silicon wafers heated to 700° C. so a conformal elemental silicon film is formed on the wafers.

Example 3 (prophetic): forming a silicon nitride film using the Silicon Precursor Compound and ammonia ($NH_3$) with LPCVD: using a LPCVD reactor and a bubbler containing the Silicon Precursor Compound and in fluid communication with the LPCVD reactor. Then flow He carrier gas through the bubbler to carry vapor of the Silicon Precursor Compound into the LPCVD reactor, wherein the LPCVD reactor contains vaporous ammonia and a plurality of vertically oriented and spaced apart silicon wafers heated to 500° C. so a conformal silicon nitride film is formed on the wafers.

Example 4 (prophetic): forming a silicon nitride film using the Silicon Precursor Compound with ammonia and PECVD: using a PECVD reactor and a bubbler in fluid communication with the PECVD reactor. Then flow He carrier gas through the bubbler to carry vapor of the Silicon Precursor Compound into the PECVD reactor, wherein the PECVD reactor has an ammonia-derived plasma and contains a plurality of horizontally oriented and spaced apart silicon wafers heated to 500° C. such that a conformal silicon nitride film is formed on the wafers.

Example 5 (prophetic): forming a silicon oxide film using the Silicon Precursor Compound with LPCVD: using a LPCVD reactor and a bubbler in fluid communication with the LPCVD reactor. Then flow He carrier gas through the bubbler to carry vapor of the Silicon Precursor Compound into the LPCVD reactor, wherein the LPCVD reactor has an oxygen atmosphere and contains a plurality of vertically oriented and spaced apart silicon wafers heated to 500° C. such that a conformal silicon oxide film is formed on the wafers.

Example 6 (prophetic): forming a silicon carbide film using the Silicon Precursor Compound with methane and PECVD: using a PECVD reactor and a bubbler in fluid communication with the PECVD reactor. Then flow He carrier gas through the bubbler to carry vapor of the Silicon Precursor Compound into the PECVD reactor, wherein the PECVD reactor has a methane-derived plasma and contains a plurality of horizontally oriented and spaced apart silicon wafers heated to 500° C. such that a conformal silicon carbide film is formed on the wafers.

Example 7 (prophetic): forming a silicon nitride film using an ALD reactor and a bubbler in fluid communication with the ALD reactor. The ALD reactor is purged with argon, wherein the ALD reactor contained a plurality of horizontally oriented and spaced apart silicon wafers heated to 500 to 800° C. Then the vapor of Silicon Precursor Compound is flowed into the ALD reactor for 10 seconds. The ALD reactor is then purged again with argon to remove any residual vapor of the Silicon Precursor Compound. Next, ammonia is flowed into the ALD reactor for 10 seconds. Then the ALD reactor is purged again with argon to remove any residual ammonia. The foregoing sequence of steps (Silicon Precursor, purging, ammonia, purging) is then repeated until a conformal silicon nitride film with a desired thickness is formed on the wafers.

Example 8: forming a silicon nitride using a PEALD reactor and a bubbler in fluid communication with the PEALD reactor. The PEALD reactor is purged with nitrogen, wherein the PEALD reactor contains a plurality of horizontally oriented and spaced apart silicon wafers heated to a temperature from 350 to 500° C. Then the vapor of Silicon Precursor Compound is flowed into the PEALD reactor. The PEALD reactor was then purged again with nitrogen to remove any residual vapor of the Silicon Precursor Compound. Next, nitrogen atom containing species such as ammonia, nitrogen, mixture of nitrogen and hydrogen (forming gas) are flowed into the PEALD reactor with plasma power on. The PEALD reactor was then purged again with nitrogen to remove any residual reactive species generated by plasma. The foregoing sequence of steps was then repeated until a conformal silicon nitride film with a desired thickness was formed on the wafers.

Example 9 (prophetic): forming a silicon oxide film using an ALD reactor and a bubbler in fluid communication with the ALD reactor. The ALD reactor is purged with Ar, wherein the ALD reactor contains a plurality of horizontally oriented and spaced apart silicon wafers heated to either 400 to 800° C. Then the vapor of Silicon Precursor Compound was flowed into the ALD reactor. The ALD reactor was purged again with Ar to remove any residual vapor of the Silicon Precursor Compound. Then ozone is flowed into the ALD reactor. The ALD reactor was purged again with Ar to remove any ozone. The foregoing sequence of steps was repeated until a conformal silicon oxide film with a desired thickness is formed on the wafers.

Comparative Examples (1-4): forming a silicon nitride film using the hexachlorodisilane (HCDS) or pentachlorodisilane (PCDS) with ammonia ($NH_3$)/nitrogen and PEALD. A PEALD reactor and a small cylinder containing the HCDS or PCDS in fluid communication with the PEALD reactor was used. The cylinder was maintained at the room temperature or heated to increase the vapor pressure of the HCDS or PCDS. The PEALD reactor was purged with nitrogen ($N_2$). The PEALD reactor contained a plurality of horizontally oriented and spaced silicon wafers heated to the set point of 400-500° C. Then PEALD SiN film was grown with HCDS or PCDS in the following sequences: HCDS or PCDS dose, 1 sec/$N_2$ Purge, 30 sec/Plasma with $NH_3$+$N_2$, 15 sec/$N_2$ Purge, 30 sec. The foregoing sequence of steps were repeated until a silicon nitride film with a desired thickness was formed on the wafers.

Examples (10-18): forming a silicon nitride film using the trichlorodisilane (3CDS) with ammonia/nitrogen and PEALD: A PEALD reactor and a small cylinder containing the 3CDS and in fluid communication with the PEALD reactor were used. The cylinder was maintained at room temperature or heated to increase vapor pressure of the 3CDS. The PEALD reactor was purged with nitrogen ($N_2$). The PEALD reactor contained a plurality of horizontally oriented and spaced apart silicon wafers heated to the set point of 350-500° C. Then PEALD SiN films were grown with 3CDS in following sequences: 3CDS dose, 1-7 sec/$N_2$ Purge, 30 sec/Plasma with $NH_3$+$N_2$, 15 sec/$N_2$ Purge, 30 sec. The foregoing sequence of steps were repeated until a silicon nitride film with a desired thickness was formed on the wafers. The films deposited from 3CDS have much lower WER than the films deposited from HCDS or PCDS under the same conditions. HCDS is an incumbent precursor for PEALD SiN films.

TABLE 2

Results of testing of films for Examples 10-18 and Comparative Examples 1-4 (C1-C4 in table).

| Example # | Precursor | Precursor Pulse Time *(sec) | Set Temp (° C.) | RF Power** (W) | GPC (Å/cycle) | RI @ 632.8 nm | WER of PEALD SiN in 500:1 HF solution (nm/min) |
|---|---|---|---|---|---|---|---|
| 18 | 3CDS | 1 | 350 | 100 | 0.50 | 1.83 | 3.8 |
| 10 | 3CDS | 3 | 350 | 100 | 0.56 | 1.80 | 4.3 |
| 11 | 3CDS | 7 | 350 | 100 | 0.55 | 1.80 | 4.1 |
| 12 | 3CDS | 1 | 400 | 100 | 0.53 | 1.83 | 3.1 |
| 13 | 3CDS | 3 | 400 | 100 | 0.57 | 1.83 | 2.1 |
| 14 | 3CDS | 7 | 400 | 100 | 0.58 | 1.83 | 2.2 |
| 15 | 3CDS | 1 | 500 | 100 | 0.56 | 1.86 | 1.1 |
| 16 | 3CDS | 3 | 500 | 100 | 0.57 | 1.85 | 0.9 |
| 17 | 3CDS | 7 | 500 | 100 | 0.60 | 1.86 | 0.9 |
| C-1 | PCDS | 1 | 400 | 100 | 0.88 | 1.83 | 5.8 |
| C-2 | PCDS | 1 | 500 | 100 | 0.85 | 1.84 | 3.6 |
| C-3 | HCDS | 1 | 400 | 100 | 0.73 | 1.81 | 6.3 |
| C-4 | HCDS | 1 | 500 | 100 | 0.65 | 1.82 | 4.9 |

The invention is further defined by the following aspects of the invention.

Aspect 1. A method of forming a silicon-containing film on a substrate, the method comprising subjecting a vapor of a silicon precursor consisting of trichlorodisilane to deposition conditions in the presence of the substrate so as to form a silicon-containing film on the substrate, wherein the silicon-containing film is a silicon nitrogen film or a silicon oxygen film and the method uses atomic layer deposition.

Aspect 2. The method of aspect 1 comprising subjecting a first vapor of the silicon precursor and a second vapor comprising helium or hydrogen to deposition conditions in the presence of the substrate so as to form the silicon-containing film on the substrate.

Aspect 3. The method of aspect 1 comprising subjecting a first vapor of the silicon precursor and a second vapor of a nitrogen precursor comprising molecular nitrogen, ammonia, amine, hydrazine, or a combination of any two or three thereof to deposition conditions in the presence of the substrate so as to form the silicon-containing film on the substrate, wherein the silicon-containing film is the silicon nitrogen film.

Aspect 4. The method of aspect 1 comprising subjecting a first vapor of the silicon precursor and a second vapor of an oxygen precursor comprising molecular oxygen, ozone, nitric oxide, nitrogen dioxide, water, hydrogen peroxide, or a combination of any two or three thereof to deposition conditions in the presence of the substrate so as to form the silicon-containing film on the substrate, wherein the silicon-containing film is the silicon oxygen film.

Aspect 5. The method of any one of aspects 2-4 wherein the substrate is heated and disposed in a deposition reactor that is configured for atomic layer deposition, the method comprising repeatedly feeding the first vapor of the silicon precursor, purging with an inert gas, feeding the second vapor into the deposition reactor, and purging with an inert gas so as to form the silicon-containing film on the heated substrate, wherein the feeds may be the same or different.

Aspect 6. The method of aspect 1, wherein the atomic layer deposition is plasma enhanced atomic layer deposition and wherein the plasma is ammonia plasma in nitrogen or argon or wherein the plasma is forming gas plasma.

Aspect 7. The method of aspect 1, wherein the atomic layer deposition is thermal atomic layer deposition.

Aspect 8. The method of aspect 3, wherein the vapor deposition conditions lack carbon and oxygen and the silicon nitrogen film comprises a silicon nitride film.

Aspect. The method of any one of the preceding aspects wherein the substrate is a semiconductor material.

Aspect 9. A composition for forming a silicon nitrogen film, the composition comprising a silicon precursor consisting of trichlorodisilane and a nitrogen precursor.

Aspect 10. Use of the composition of aspect 9 in a method of forming of a silicon nitrogen film.

The below claims are incorporated by reference here, and the terms "claim" and "claims" are replaced by the term "aspect" or "aspects," respectively. Embodiments of the invention also include these resulting numbered aspects.

What is claimed is:

1. A method of forming a silicon nitrogen-film on a substrate, the method comprising subjecting a first vapor of a silicon precursor comprising 1,1,1-trichlorodisilane and a second vapor of a nitrogen precursor comprising molecular nitrogen, ammonia, amine, hydrazine, or a combination of any two or three thereof to deposition conditions in the presence of the substrate, so as to form a silicon nitrogen film having a wet etch rate of less than 3.1 nanometers/minute when using a 500:1 HF:water solution on the substrate, wherein the substrate is heated and disposed in a deposition reactor that is configured for atomic layer deposition and has a reactor temperature of 400° C. to 800° C., the method comprising repeatedly feeding the first vapor, purging with an inert gas, feeding the second vapor into the deposition reactor, and purging with an inert gas so as to form the silicon nitrogen film on the heated substrate using atomic layer deposition, wherein the atomic layer deposition comprises plasma enhanced atomic layer deposition or thermal atomic layer deposition and wherein the feeds may be the same or different.

2. The method of claim 1 wherein the silicon nitrogen film has a wet etch rate that is less than the wet etch rate for a silicon-containing film deposited from hexachlorodisilane.

3. The method of claim 1, wherein the atomic layer deposition is plasma enhanced atomic layer deposition and wherein the plasma is ammonia plasma in nitrogen or argon, forming gas plasma, nitrogen plasma, or oxygen plasma.

4. The method of claim 1, wherein the first and second vapor are free of carbon and oxygen and the silicon nitrogen film comprises a silicon nitride film.

5. The method of claim 1 wherein the substrate is a semiconductor material.

* * * * *